United States Patent
Coolbaugh et al.

(10) Patent No.: US 6,720,590 B2
(45) Date of Patent: Apr. 13, 2004

(54) C IMPLANTS FOR IMPROVED SIGE BIPOLAR YIELD

(75) Inventors: Douglas D. Coolbaugh, Essex Junction, VT (US); Kathryn T. Schonenberg, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/338,476

(22) Filed: Jan. 8, 2003

(65) Prior Publication Data

US 2003/0136975 A1 Jul. 24, 2003

Related U.S. Application Data

(62) Division of application No. 09/878,605, filed on Jun. 11, 2001, now Pat. No. 6,534,371.

(51) Int. Cl.$^7$ .......................................... H01L 31/0328
(52) U.S. Cl. ................................. 257/197; 257/616
(58) Field of Search ................................ 257/197, 198, 257/200, 201, 616; 438/312, 520, 528

(56) References Cited

U.S. PATENT DOCUMENTS

| 5,323,031 A | 6/1994 | Shoji et al. |
|---|---|---|
| 5,376,560 A | 12/1994 | Aronowitz et al. |
| 5,441,901 A | 8/1995 | Candelaria |
| 5,731,626 A | 3/1998 | Eaglesham et al. |
| 5,753,560 A | 5/1998 | Hong et al. |
| 6,043,139 A | 3/2000 | Eaglesham et al. |
| 6,093,613 A | 7/2000 | Verma et al. |
| 6,316,795 B1 | 11/2001 | Croke, III |
| 6,465,317 B2 * | 10/2002 | Marty ..................... 438/321 |
| 6,492,711 B1 * | 12/2002 | Takagi et al. ............ 257/593 |

FOREIGN PATENT DOCUMENTS

FR    WO 01/24249    4/2001

OTHER PUBLICATIONS

Nishikawa, S., et al., "Reduction of transient boron diffusion in preamorphized Si by carbon implantation," Appl. Phys. Lett., 60(18), May 4, 1992.
L.D. Lanzerotti, et al., "Suppression of Boron Outdiffusion in SiGe HBTs by Carbon Incorporation," IEDM Technical Digest, San Francisco, Dec. 1996, pp. 249–252.
E.J. Prinz, et al., "The Effects of Base Dopant Outdiffusion and Undoped SiGe Junct. Spacer Layers in Si/SiGe/Si Heterojunction Bipolar Transistors," IEEE Elect. Device Lett., vol. 12, No. 2, (1991) pp. 42–44.
I. Ban, et al., "Suppression of Oxidation Enhanced Boron Diffusion is Silicon by Carbon Implantation and Characteriz. of MOSFETs with Carbon Implanted Channels," IEEE Trans. Electr. Dev., vol. 44, (1997) pp. 1544–1551.

* cited by examiner

*Primary Examiner*—Tuan H. Nguyen
(74) *Attorney, Agent, or Firm*—Scully, Scott, Murphy & Presser; William D. Sabo, Esq.

(57) ABSTRACT

A method for improving the SiGe bipolar yield as well as fabricating a SiGe heterojunction bipolar transistor is provided. The inventive method includes ion-implanting carbon, C, into at one of the following regions of the device: the collector region, the sub-collector region, the extrinsic base regions, and the collector-base junction region. In a preferred embodiment each of the aforesaid regions include C implants.

11 Claims, 3 Drawing Sheets

C IMPLANTS FOR IMPROVED SIGE BIPOLAR YIELD

RELATED APPLICATIONS

This application is a divisional of U.S. application Ser. No. 09/878,605, filed Jun. 11, 2001, now U.S. Pat. No. 6,534,371.

FIELD OF THE INVENTION

The present invention relates to semiconductor heterojunction bipolar transistors, and more particularly to a method of fabricating a SiGe heterojunction bipolar transistor in which the SiGe bipolar yield is substantially improved by suppressing dislocations that cause collector-emitter (CE) leakage or shorts, or collector-base (CB) leakage or shorts.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream CMOS development for wide market acceptance, providing the advantages of SiGe technology for analog and RF circuitry while maintaining the full utilization of the advanced CMOS technology base for digital logic circuitry.

It is well documented that excess interstitials created by implant damage cause the formation of dislocations in the collector and emitter regions of bipolar devices. When the dislocations extend between the collector and emitter regions, bipolar pipe shorts, i.e., collector-emitter shorts, may occur. In such a context, SiGe bipolar yield can be reduced by as much as 20 to 50% for dislocations originating in the collector region.

The incorporation of C, carbon, into SiGe heterojunction devices has been carried out in the prior art to prevent the out-diffusion of boron into the base region. For example, it is known that the transient enhanced diffusion of boron is strongly suppressed in carbon-rich silicon layers; See, for example, H. J. Osten, et al., "Carbon Doped SiGe Heterojunction Bipolar Transistors for High Frequency Applications", IEEEBTCM 7.1, 109. Boron diffusion in silicon occurs via an interstitial mechanism and is proportional to the concentration of silicon self-interstitials. Diffusion of carbon out of the carbon-rich regions causes an undersaturation of silicon self-interstitials. As a result, the diffusion of boron in these regions will be suppressed. Despite being capable of suppressing the diffusion of boron, prior art methods that incorporate C into the SiGe heterojunction bipolar structure do not prevent bipolar pipe shorts from occurring. Thus, prior art methods do not improve the SiGe bipolar yield.

In view of the SiGe bipolar yield problem mentioned above, there is a continued need for providing a new and improved method for improving SiGe heterojunction bipolar yield due to dislocations originating in the pedestal and collector regions of the device.

SUMMARY OF THE INVENTION

One object of the present invention is to provide a method of fabricating a SiGe heterojunction bipolar transistor wherein improved SiGe bipolar yield is achieved.

Another object of the present invention is to provide a method of fabricating a SiGe heterojunction bipolar transistor in which the amount of dislocations present in the device is substantially reduced thereby avoiding pipe shorts.

A further object of the present invention is to provide a method of fabricating a SiGe heterojunction bipolar transistor using processing steps that are compatible with existing bipolar and CMOS processing steps.

These and other objects and advantages are achieved in the present invention by implanting carbon, C, into certain predetermined regions of the SiGe bipolar transistor. Specifically, applicants have determined that by incorporating C (via implantation only) into the sub-collector, the collector, the extrinsic base and the collector-base junction region of a bipolar device, separately or in any combination, improved SiGe bipolar yield can be obtained. The carbon implant(s) may be carried out by blanket or masked implant techniques well known to those skilled in the art.

The greatest enhancement and most preferred embodiment of the present invention is obtained when all the C implants, as defined hereinabove, are employed. The improved SiGe bipolar yield obtained by the present invention is a significant advancement in this art since it results in a device having substantially less pipe shorts than heretofore possible with prior art SiGe heterojunction bipolar devices.

Broadly speaking, the present invention includes a method for improving the SiGe bipolar yield which comprises the steps of:

(a) providing a structure which includes at least a bipolar device region, said bipolar device region comprising at least a collector region formed over a sub-collector region, and a SiGe layer formed over said collector and subcollector regions, said SiGe layer comprising at least an intrinsic base region and a collector-base junction region, wherein said intrinsic base region is abutted by extrinsic base regions; and (b) implanting C into at least one region of said structure selected from said collector, said sub-collector, said extrinsic base regions and said collector-base junction region.

In one embodiment of the present invention, the SiGe layer is grown utilizing a non-selective epi process. In this embodiment, the SiGe layer would include extrinsic base regions abutting the intrinsic base region. In other embodiments, the SiGe layer is formed without extrinsic base regions. In that embodiment, the extrinsic base regions, which may or may not include germanium, are formed separately from the SiGe layer.

In a preferred embodiment of the present invention, the method of the present invention comprises the steps of:

(a) providing a structure which includes at least a bipolar device region, said bipolar device region comprising at least a collector region formed over a sub-collector region;

(b) implanting C into said collector and said sub-collector regions;

(c) forming a SiGe layer on said bipolar device region, said SiGe layer comprising at least an intrinsic base region and a collector-base junction region, wherein said intrinsic base region is abutted by extrinsic base regions;

(d) implanting C into said extrinsic base regions;

(e) forming an insulator layer on said SiGe layer;

(f) providing an emitter opening in said insulator layer so as to expose a portion of said intrinsic base region and implanting C through said emitter opening and through the exposed portion of said intrinsic base region into the collector-base junction region; and (g) forming an emitter polysilicon region on said insulator layer, including in said emitter opening.

A further aspect of the present invention relates to a SiGe heterojunction bipolar transistor that has improved SiGe bipolar yield. Specifically, the inventive SiGe heterojunction bipolar transistor comprises:

a semiconductor substrate of a first conductivity type including at least a sub-collector region and a collector region;

a SiGe base layer formed on said substrate, said SiGe base layer comprising at least collector-base junction region formed over the collector region and an intrinsic base region, wherein said intrinsic base region is abutted by extrinsic base regions; and an emitter region formed on a portion of said intrinsic base region, said emitter region comprising at least an emitter polysilicon region, wherein at least one region of said structure selected from said collector, said sub-collector, said extrinsic base regions and said collector-base junction region includes a C implant.

In another preferred embodiment of the present invention, the bipolar transistor comprises:

a semiconductor substrate of a first conductivity type including at least a sub-collector region and a collector region which are both doped with implanted C;

a SiGe base layer formed on said substrate, said SiGe base layer comprising at least a collector-base junction region formed over the collector region, an intrinsic base region and extrinsic base regions abutting said intrinsic base region, wherein said collector-base junction region and said extrinsic base regions are doped with implanted C; and an emitter region formed on a portion of said intrinsic base region, said emitter region comprising at least an emitter polysilicon region.

Note that each of the C-doped regions is formed by implanting C into the specific region by utilizing the method of the present invention.

DETAILED DESCRIPTION OF THE INVENTION

Figure 1:
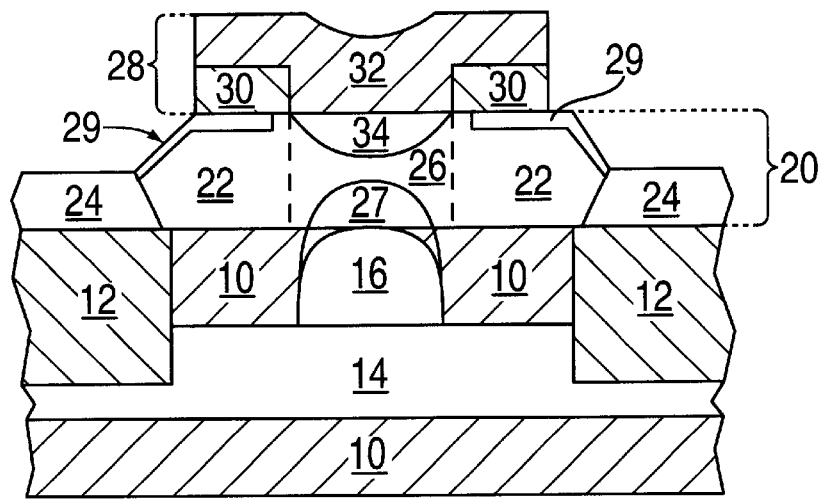
FIG 1 is a cross-sectional view of the inventive SiGe heterojunction bipolar transistor which includes C incorporated into the collector, sub-collector, and extrinsic base regions and/or collector-base junction region of the device.

The present invention which is related to the use of C implants for improving SiGe bipolar yield will now be described in more detail by referring to FIGS. 1–7 and the discussion that appears hereinbelow. It is noted that in the drawings like and corresponding elements are referred to by like reference numerals. Also, for simplicity, only one bipolar device region is shown in the drawings. Other bipolar device regions as well as digital logic circuitry may be formed adjacent to the bipolar device region depicted in the drawings.

Before discussing the present invention in detail, it is noted that the drawings depict the preferred embodiment of the invention wherein the SiGe layer is formed with extrinsic base regions abutting the intrinsic base regions. In this embodiment the extrinsic base regions are formed by a non-selective epi deposition process. In addition to this embodiment, the present invention also contemplates SiGe layers in which the extrinsic base regions are formed separately from the SiGe layer. Also, note that in the description that follows implantation of C occurs in all four regions, i.e., the collector, sub-collector, extrinsic base regions and said collector-base junction region. Such C implantation into all four regions represents the most preferred embodiment of the present invention. The present invention is however not limited to C implants into each of these four regions. Instead, in the present invention, at least one of the regions must include C implants.

Reference is first made to FIG. 1 which represents a cross-sectional view of the inventive SiGe heterojunction bipolar transistor. Specifically, the SiGe heterojunction bipolar transistor comprises semiconductor substrate 10 of a first conductivity type (N or P), sub-collector region 14 and collector region 16 which are both doped with C via implantation. Isolation regions 12 which are also present in the structure define the outer boundaries of the bipolar device region and serve to isolate the bipolar device region shown in FIG. 1 from adjacent device regions (not shown).

The SiGe bipolar transistor of FIG. 1 also includes SiGe base layer 20 formed on substrate 10 as well as on isolation regions 12. In accordance with the present invention, the SiGe base layer includes polycrystalline Si regions 24 that are formed predominately over isolation regions 12, and single-crystal SiGe region 22, which includes extrinsic SiGe base regions 29, intrinsic SiGe base region 26, and collector-base junction region 27, also referred to in the art as the pedestal region of the device, formed predominately over sub-collector region 14. In accordance with a preferred embodiment of the present invention, the collector-base junction region, and the extrinsic base regions are both doped with C via implantation. Note that the solid line separating each polycrystalline SiGe region from the single-crystal SiGe region is referred to in the art as a facet region.

The bipolar transistor of FIG. 1 also comprises emitter region 28 which includes patterned insulator layer 30 which has an emitter opening formed therein and a region of emitter polysilicon 32 formed on said patterned insulator layer as well as in said emitter opening. The emitter polysilicon is typically doped $N^+$. Note that after formation of the emitter polysilicon, dopant from the emitter polysilicon is diffused into the intrinsic base region forming emitter diffusion region 34 in the intrinsic base region 26.

It is noted that the bipolar transistor shown in FIG. 1 has improved SiGe bipolar yield because the C implants in the above identified regions, i.e., sub-collector, collector, extrinsic base and/or collector-base junction region, reduce the number of dislocations that are present in the structure. Note, that it is possible to have improved bipolar yield (i.e., emitter-base or emitter-collector leakage yield) when at least one of the above-mentioned regions is doped with C implants; however the greatest affect is observed when all the regions include C implants. In the present invention, bipolar yield may be improved as much as 20 to 50%; therefore the present invention provides an improved structure compared with prior art SiGe bipolar transistors which do not contain C implants in the collector, sub-collector, extrinsic base regions and/or the collector-base junction region.

Figure 2:
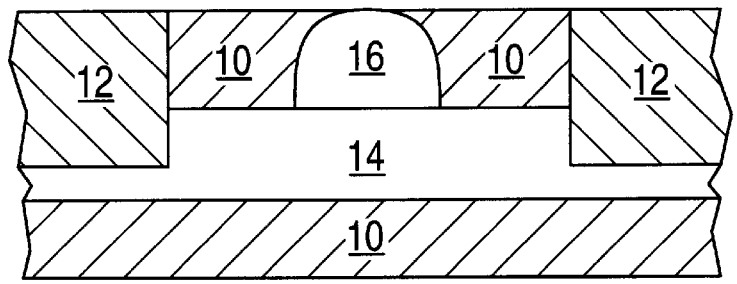
FIGS. 2–7 are cross-sectional views which shown the structure of FIG. 1 through various processing steps of the present invention.

The method and various materials that are employed in forming the SiGe heterojunction bipolar transistor shown in FIG. 1 will now be described in more detail. Reference is first made to FIG. 2 which shows the bipolar device region of an initial structure that is employed in the present invention. The initial structure shown in FIG. 2 comprises substrate 10 having sub-collector region 14, collector region 16 and isolation regions 12 formed therein.

The structure shown in FIG. 2 is fabricated using conventional processing steps that are well known to those skilled in the art. Moreover, conventional materials that are also well known in the art are used in fabricating the same. For example, substrate 10 is composed of any semiconducting material including but not limited to: Si, Ge, SiGe, GaAs, InAs, InP and all other III/V compound semiconductors. Layered substrates comprising the same or different semiconducting material, e.g., Si/Si or Si/SiGe, are also contemplated herein. Of these semiconducting materials, it is preferred that substrate 10 be composed of Si. As mentioned above, the substrate may be a N-type substrate or a P-type substrate depending on the type of device to be subsequently formed.

Sub-collector region 14 is formed in, or alternatively on the substrate by using any well known technique that is capable of forming a sub-collector region in such a structure. Thus, the sub-collector region can be formed via implantation or by an epitaxial growth process. Note that the drawings depict a sub-collector region that is formed into the substrate via ion implantation. Isolations regions 12 are then formed by either using a conventional local oxidation of silicon (LOCOS) process or by utilizing lithography, etching and trench isolation filling.

Following the formation of isolation regions in the substrate, collector region 16 is then formed in the bipolar device region (between the two isolation regions shown in FIG. 1) utilizing conventional ion implantation and activating annealing processes that are well known to those skilled in the art. The activating annealing process is typically carried out at a temperature of about 950° C. or above for a time of about 30 seconds or less.

At this point of the inventive process, the bipolar device region shown in the drawings may be protected by forming a protective material such as $Si_3N_4$ thereon, and conventional processing steps which are capable of forming adjacent device regions can be performed. After completion of the adjacent device regions and subsequent protection thereof, the inventive process continues. It should be noted that in some embodiments, the adjacent device regions are formed after completely fabricating the bipolar transistor.

Figure 3:
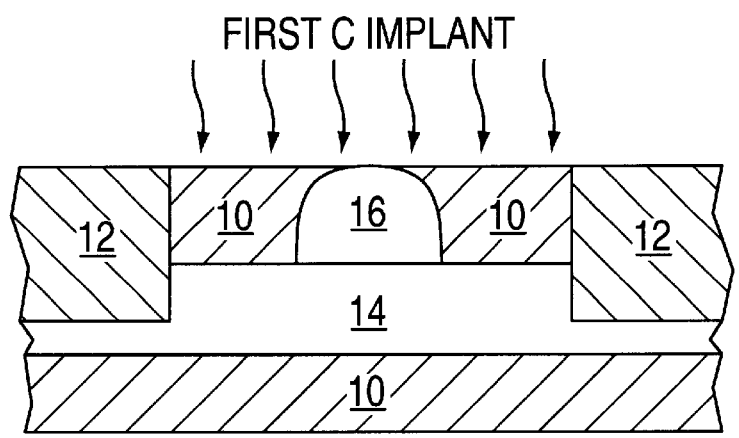

The next step of the inventive process is shown in FIG. 3. Specifically, FIG. 3 shows the ion implantation of C into sub-collector region 14 and collector region 16. The source of carbon used for implanting these regions is a C-containing material such as $CO_2$ or any other C-containing gas source. This first C implantation step which may be carried out utilizing a one or two-step process is carried out using a C dose of from about 1E13 to about 1E16 $cm^{-2}$. An implantation energy of from about 5 to about 200 keV is employed for implanting C into the collector region, whereas an energy of from about 10 to about 1000 keV is employed for implanting C into the sub-collector region. More preferably, this first C implantation step is carried out using a C dose of about 1E14 $cm^{-2}$ and an implantation energy of about 20 keV for the collector region and about 400 keV for the sub-collector region. The C source may be used neat (i.e., non-mixed), or it may be mixed with an inert gas such as He or Ar. These implants may be blanket or masked using techniques well known to those skilled in the art. In some embodiments, it is possible to omit implanting C into the collector and subcollector regions.

Note that the C implant into the sub-collector region may occur during formation of the isolation regions or may occur after formation of the isolation regions, as is shown herein. Insofar as the collector region is concerned, the collector region is typically implanted with C after the adjacent devices have been formed and protected.

Applicants have determined that the first C implant step mentioned above allows for a carbon source to be present in the structure that will reduce the level of free interstitials forming dislocations at the base of the SiGe layer. Without wishing to be bound by any theory, the mechanism of reduction of interstitial levels due to C implant is believed to be as follows: C in substitutional or interstitial positions reacts with interstitial Si atoms. The C—Si pairs are either complexed with other C atoms or diffuse out from the high concentration interstitial region. This causes a reduction in the overall concentration of interstitials thereby reducing the level of dislocations that may be formed. C implantation into the sub-collector region typically occurs prior to C implantation into the collector region.

Figure 4:
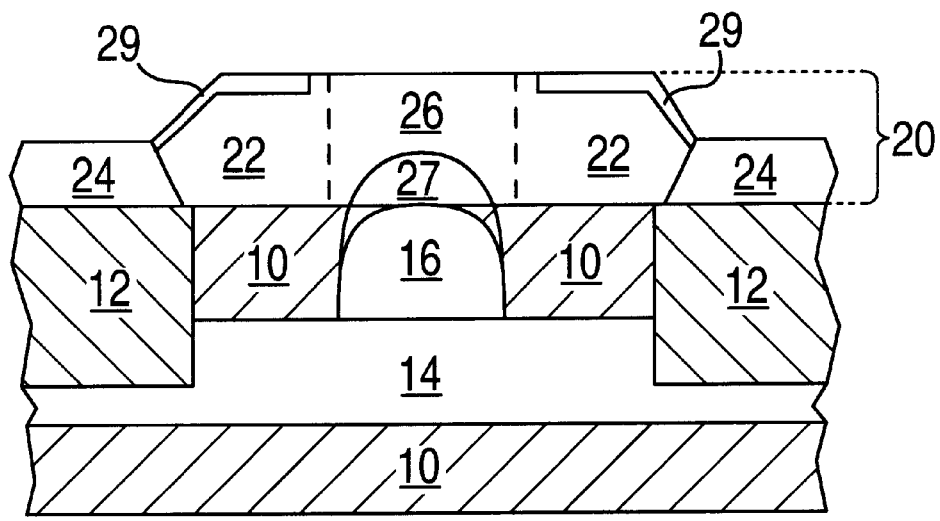

The next step of the present invention is shown in FIG. 4. In this figure, SiGe layer 20 is formed on substrate 10 as well as on isolation regions 12. In accordance with a preferred embodiment of the present invention, the SiGe layer includes polycrystalline Si regions 24 that are formed predominately over isolation regions 12, and single-crystal SiGe layer 22 that is formed predominately over the sub-collector region. The single-crystal SiGe region further includes extrinsic SiGe base regions 29 and intrinsic SiGe base region 26. The extrinsic base region is an implanted region which can be formed by either a blanket ion implantation process or a combined patterning/ion implantation process. The SiGe layer is formed epitaxially utilizing a well-known deposition process including, but not limited to: ultra-high vacuum chemical vapor deposition (UHVCVD) and rapid thermal chemical vapor deposition (RTCVP).

It is again emphasized that the present invention is not limited to the embodiment wherein the SiGe layer is formed by epitaxial deposition. Note that when epi processes are employed the SiGe layer is formed with extrinsic base regions abutting the intrinsic base region. The present invention also contemplates cases wherein the extrinsic base regions are formed during the deposition of the SiGe layer utilizing the processes mentioned above.

Figure 5:
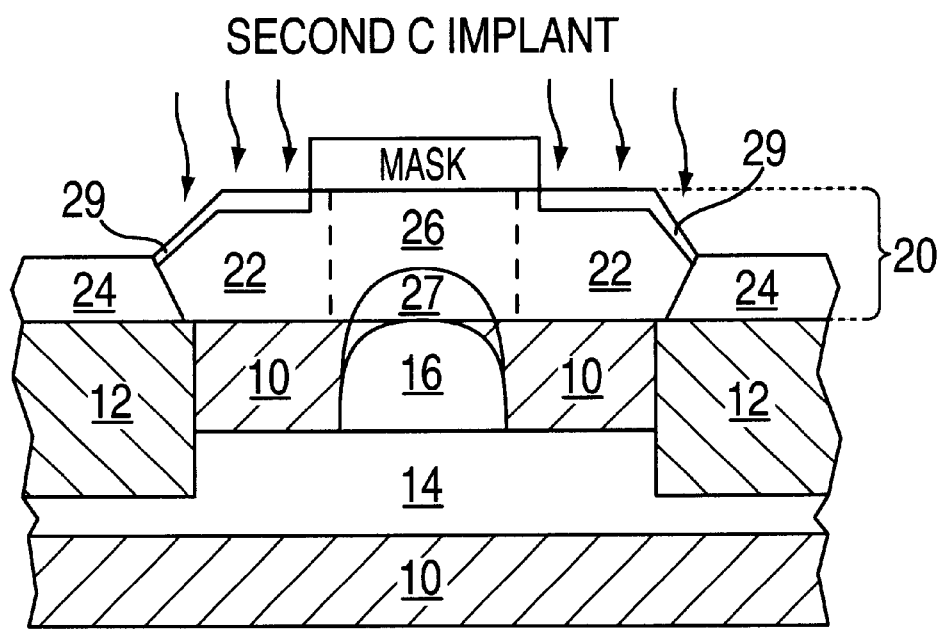

To reduce dislocations at the base region, a second C implantation step, as shown in FIG. 5, is performed. Specifically, it has been determined that C implantation into both the extrinsic base regions and the collector-base junction region reduces the level of dislocations present in the structure. The second C implantation step which implants C into the extrinsic SiGe base regions is carried out using a C dose of from about 1E13 to about 1E16 $cm^{-2}$ and an implantation energy of from about 5 to about 200 keV. More preferably, the second C implantation step is carried out using a C dose of about 1E14 $cm^{-2}$ and an implantation energy of about 15 keV. The same or different C source as used in the first C implantation step may be used in the second carbon implantation step. Note that in some embodiments, the second implant step, i.e., C implant into the extrinsic base regions, may be omitted.

An N-type dopant implant (not shown) may optionally be carried out in the pedestal, i.e., collector-base junction region 27, and/or collector region 16 at this point of the inventive method so as to form a device which operates at high-speeds. The optional N-type dopant implant is carried out using conventional processing techniques that are well known to those skilled in the art including, for example, ion implantation and activation annealing. It is noted that during this implant step, dislocations may also form in the structure causing shorts due to implantation damage caused by the implant. The region where this occurs in is typically just below the intrinsic SiGe base region.

Figure 6:
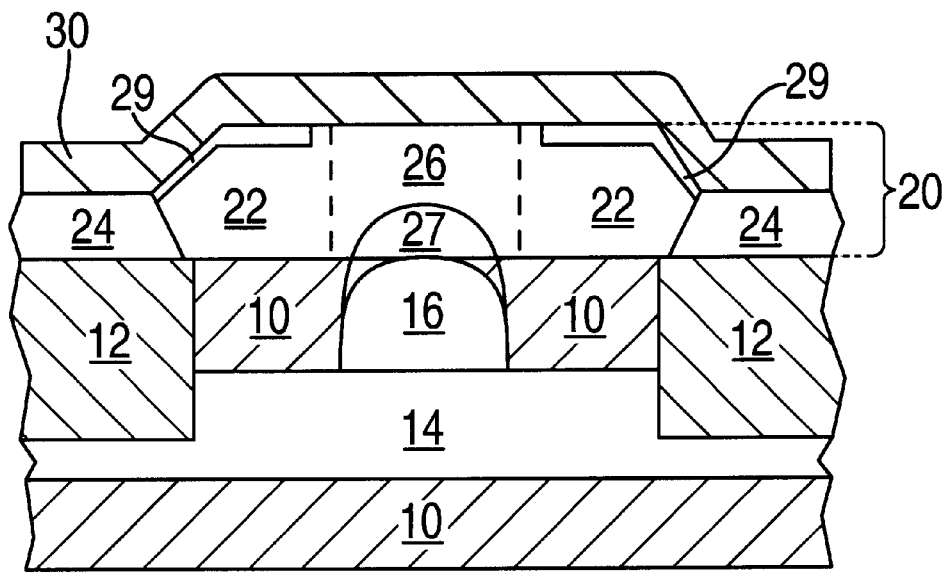

Next, and as shown in FIG. 6, an insulator layer 30 is formed on SiGe base layer 20 utilizing a conventional deposition process such as CVD, plasma-assisted CVD, chemical solution deposition and other like deposition processes. The insulator may be a single layer, as is shown in FIG. 6, or it may contain multi-insulator layers. Insulator layer 30 is composed of the same or different insulator material which is selected from the group consisting of $SiO_2$, Si oxynitride and other like insulators.

Figure 7:
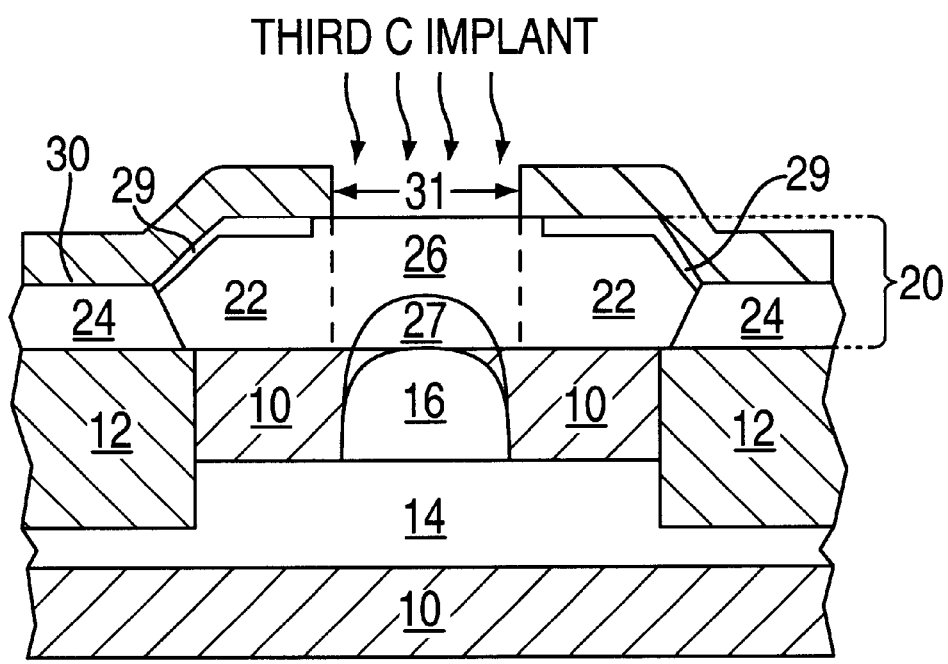

Emitter opening 31 is then formed in insulator layer 30 so as to expose a portion of the intrinsic base region, See FIG. 7. The emitter opening is formed utilizing lithography and etching. The etching step used is selective in removing the insulator material as compared to the SiGe layer. At this point of the present invention, C may be implanted into collector-base junction region 27, also referred to in the art as a pedestal region of the device, using a third C ion implantation process that is carried out using a C dose of from about 1E13 to about 1E16 $cm^{-2}$ and at an energy of from about 5 to about 200 keV. More preferably, the third C implant is carried out at a C dose of about 1E14 $cm^{-2}$ and an energy of about 50 keV. Note that the third C implant step includes the use of the same or different C source as the first C implant step and that in some embodiments the third implant may be omitted.

Following formation of the emitter opening, emitter polysilicon layer 32 is formed on the insulator layer and in the emitter opening by utilizing a conventional deposition process such as CVD. The emitter polysilicon and the insulator are then selectively removed so as to form emitter region 28 on the SiGe base region, See FIG. 1. Specifically, lithography and etching are employed in forming the structure shown in FIG. 1. It is should be noted that a single etching process may be employed in removing portions of emitter polysilicon layer 32 and insulator layer 30, or separate etching steps may be employed in removing these layers.

Conventional BiCMOS processing steps may then be performed on the structure shown in FIG. 1. Note that emitter diffusion region 34 is formed in the intrinsic base region 26 during a subsequent annealing step.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A SiGe heterojunction bipolar transistor having improved SiGe bipolar yield comprising:
 a semiconductor substrate of a first conductivity type including at least a sub-collector region and a collector region;
 a SiGe base layer formed on said substrate, said SiGe base layer comprising at least a collector-base junction region formed over the collector region and an intrinsic base region, wherein said intrinsic base region is abutted by extrinsic base regions that are located in upper regions of a single-crystal SiGe region; and
 an emitter region formed on a portion of said intrinsic base region, said emitter region comprising at least an emitter polysilicon region, wherein at least one region of said structure selected from said collector, said sub-collector, said extrinsic base regions and said collector-base junction region includes a C implant.

2. The SiGe heterojunction bipolar transistor of claim 1 wherein said substrate is a semiconducting material selected from the group consisting of Si, Ge, SiGe, GaAs, InAs, InP and layered semiconductors.

3. The SiGe heterojunction bipolar transistor of claim 2 wherein said semiconducting material is Si.

4. The SiGe heterojunction bipolar transistor of claim 1 wherein said substrate further includes isolation regions.

5. The SiGe heterojunction bipolar transistor of claim 4 wherein said isolation regions are LOCOS regions or trench isolation regions.

6. The SiGe heterojunction bipolar transistor of claim 1 wherein said SiGe base layer is an epi-SiGe layer.

7. The SiGe heterojunction bipolar transistor of claim 6 wherein said SiGe base layer includes polycrystalline SiGe regions abutting the single-crystal SiGe region.

8. The SiGe heterojunction bipolar transistor of claim 1 wherein said emitter region includes a patterned insulator layer.

9. The SiGe heterojunction bipolar transistor of claim 8 wherein said patterned insulator layer is composed of an insulator material selected from the group consisting of $SiO_2$, Si oxynitride and multi-layers thereof.

10. The SiGe heterojunction bipolar transistor of claim 1 further comprising digital logic circuitry formed adjacent thereto.

11. A SiGe heterojunction bipolar transistor comprising: bipolar transistor comprises:
 a semiconductor substrate of a first conductivity type including at least a sub-collector region and a collector region which are both doped with implanted C;
 a SiGe base layer formed on said substrate, said SiGe base layer comprising at least a collector-base junction region formed over the collector region, an intrinsic base region, and extrinsic base regions abutting said intrinsic base region, wherein said collector-base junction region and said extrinsic base regions are doped with implanted C; and
 an emitter region formed on a portion of said intrinsic base region, said emitter region comprising at least an emitter polysilicon region.

* * * * *